United States Patent [19]

Nguyen

[11] Patent Number: 5,218,758
[45] Date of Patent: Jun. 15, 1993

[54] METHOD OF USING A TOOL FOR A MODULAR CONNECTOR ASSEMBLY

[75] Inventor: Hung T. Nguyen, Harrisburg, Pa.
[73] Assignee: AMP Incorporated, Harrisburg, Pa.
[21] Appl. No.: 818,301
[22] Filed: Jan. 8, 1992
[51] Int. Cl.[5] .............................................. H05K 3/30
[52] U.S. Cl. .................................... 29/837; 29/426.5; 29/525.1; 81/57.22
[58] Field of Search ................... 29/837, 426.5, 525.1, 29/762; 81/57.22, 57.3, 57.32, 57.36

[56] References Cited
U.S. PATENT DOCUMENTS

| | | | |
|---|---|---|---|
| 2,069,882 | 2/1937 | Hall | 81/57.22 |
| 3,905,254 | 9/1975 | Palatnick et al. | 81/57.3 |
| 4,515,043 | 5/1985 | Gray | 81/57.22 |
| 5,074,170 | 12/1991 | Shirley | 81/57.22 |

FOREIGN PATENT DOCUMENTS 173590 7/1965 U.S.S.R. ............................ 29/525.1

Primary Examiner—P. W. Echols
Attorney, Agent, or Firm—Anton P. Ness

[57] ABSTRACT

A tool for removal or insertion of modules within a electrical connector assembly comprises a drive means engaging a plurality of engaging means to simultaneously rotate shafts having a plurality of fastening heads. The use of the tool provides for the precise removal and insertion of such modules without damaging the electrical contacts and terminal therein.

6 Claims, 6 Drawing Sheets

METHOD OF USING A TOOL FOR A MODULAR CONNECTOR ASSEMBLY

FIELD OF THE INVENTION

The present invention relates generally to a tool for a modular connector assembly and, more particularly, to a tool that permits the insertion and extraction of filter, or transient suppression, or other modules within a shell of a modular connector assembly without damaging the individual modules.

BACKGROUND OF THE INVENTION

High-density, multiple-contact, connector assemblies are used in many applications. In aircraft, for example, such connectors are often used to interface wiring from various locations throughout the aircraft with processing circuitry located within a bulkhead of the aircraft.

In designing electrical circuitry for such connectors, the circuitry often must be protected from disruptions caused by electromagnetic interference ("EMI") including radio frequency interference ("RFI") entering the system. In addition to protecting or "filtering" electronic equipment against EMI, there is also a need to protect the equipment against power surges or "suppress transients" owing to electrostatic discharges ("ESD"), lightning and electromagnetic pulses ("EMP"). The high voltage generated by ESD, lightning and EMP can damage sensitive integrated circuits and the like. Outer shells are used with the individual filters and transient suppression diodes for each circuit grounded thereto.

A problem in the prior art has been the tedious assembly of the array of terminals and filter or transient suppression components within the main shell member to achieve proper alignment of terminals and provide for grounding to protect the assembled electrical circuitry within the modules.

A modular connector assembly for which the present invention is particularly useful is described in U.S. patent application Ser. No. 07/818,188 entitled "Modular Connector Assembly and Method of Assembling Same", filed concurrently herewith on Jun. 8, 1992 and assigned to the assignee hereof, which application is herein incorporated by reference. The filter module referenced therein is designed to allow proper mounting (and removal) of circuit protective modules within a main shell member to achieve proper alignment of electrical contacts and terminals and provide for grounding to protect the assembled electrical circuitry within the modules. This application includes descriptions of filter and transient suppression modules which may be inserted and/or removed within a modular connector assembly by the present invention. The assembly of a large number of electrical contacts requires a large, but precise application of force to assemble the modules.

It is within this context that this invention provides a number of important advantages. As can readily be understood, a tool which allows the ready removal of connector modules for replacement of such grounding or EMI strips, and re-insertion of the modules provides great advantages. During module insertion, a precise spatial relationship is maintained between each elongated electrical contact and its corresponding electrical connector terminal. This is important to the functional viability of the modular connector assembly because even a slight change in the spatial relationship will result in bending or damage to the elongated electrical contact. This is due in part to the fragile nature of the electrical contacts and terminals, and also to the precise fit of the contact into its corresponding terminal connector. Damage to even one contact will often necessitate the replacement of the entire modular connector assembly. The tool according to the present invention is also amenable to the use of robotics for modular installation.

SUMMARY OF THE INVENTION

It is an object of this invention to provide a tool for the insertion and removal of a module (such as that described in U.S. patent application Ser. No. 07/818,188 that permits proper mounting (and removal) of circuit protective modules within a main shell member to achieve proper alignment of electrical contacts and terminal and provide grounding to protect the assembled electrical circuitry within the modules.

It is a further object of the present invention to provide a method for the simple and efficient assembly of a modular connector assembly (such as that described in U.S. patent application Ser. No. 07/818,188.

It is a further object of the present invention to provide a method for assembling a high density, multi-contact filter electrical assembly.

It is a further object of the present invention to provide a tool for inserting or removing an object through the simultaneous tightening or loosening of a plurality of fastening means, thus advancing the object in a manner retaining its precise orientation with respect to the direction of movement.

According to this invention, a tool is disclosed for inserting or removing a first unit containing at least one elongated electrical pin contact into or out of a second unit containing at least one corresponding electrical socket terminal adapted to matingly receive said elongated electrical pin contact, the first unit being fastenable to the second unit by at least two fastening means. The tool according to this invention comprises a frame member, a first drive means supported by the frame member, a power delivery means fixedly attached to the first gear means, a plurality of engaging means rotationally engaged by the first drive means and having attached through its center a shaft, and a fastening head attached at one end of each of the shafts, each of the fastening heads positioned on the same side of the plurality of engaging means. The operation of the power delivery means rotates the first drive means which results in the simultaneous rotation of each of the plurality of engaging means, the attached shafts, and each fastening head.

Also, according to the present invention, a method is disclosed for removing or inserting a first unit containing at least one elongated electrical pin contact into or from a second unit containing at least one corresponding electrical socket terminal adapted to receive the elongated electrical pin contact. The first unit is fastenable to the second unit by at least two fastening means. The method comprises the steps of: providing a tool comprising a frame member, a first drive means supported by the frame member, a power delivery means fixedly attached to the first drive means, a plurality of engaging means rotationally engaged by the first drive means and having attached through its center a shaft, and a fastening head attached at one end of each of the shafts, each of the fastening heads positioned on the same side of the plurality of engaging means; engaging the fastening means with the fastening heads; and operating the power delivery means to rotate the first drive means which results in simultaneously rotating the plurality of engaging means and each of the attached fastening heads which are engaged with and rotate each of the fastening means in a substantially similar fashion, fixedly attaching the first unit to the second unit in a precise spatial relationship.

The invention itself, together with further objects and attendant advantages, will best be understood by reference to the following detailed description, taken in conjunction with the accompanying drawings.

DETAILED DESCRIPTION

Figure 1:
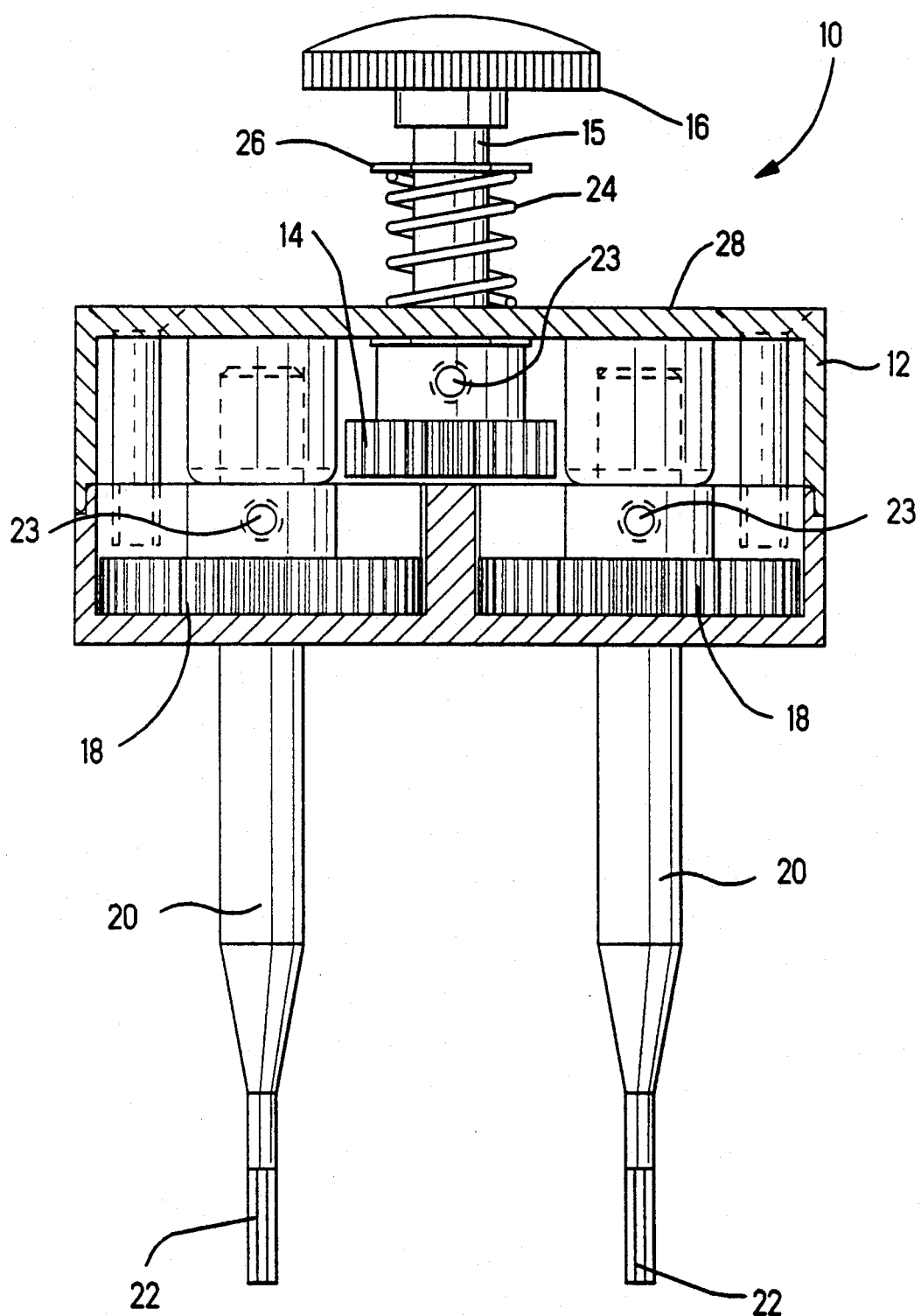
FIG. 1 is a longitudinal cross section of a tool made according to the present invention.

Turning now to the drawings, FIG. 1 illustrates a presently preferred embodiment of an insertion/removal tool 10 according to the present invention. The tool 10 comprises a frame member 12 which houses the drive or first gear means 14 with frame member 12 having upper and lower casings fastened together. Fixedly attached by a set screw 23 or the like to the first gear means 14 is a shaft 15 extending outwardly of frame member 12 to a handle 16. A plurality of engaging or gear means 18 is in contact with first gear means 14 and is also housed within frame member 12. Fixedly attached to each of the plurality of engaging gear means 18 by set screws 23 or the like is a shaft 20 which extends away from each of the plurality of engaging gear means 18 in the same direction, terminating in a work end such as hex driver 22 outside frame member 12. The cross-sectional shape of drivers 22 could be hexagonal as shown, or could be octagonal or of another particular shape useful in driving fasteners having complementarily shaped heads.

By way of example, when the drive means or handle 16 is operated or rotated, the first gear means 14 rotationally engages each of the plurality of engaging gear means 18 causing them simultaneously to rotate, likewise rotating the attached shafts 20 and hex drivers 22. In this embodiment, rotating the handle 16, and thus the first gear means 14 in the clockwise direction will turn the plurality of engaging means 18, and thus the hex drivers 22, in the counterclockwise direction. Similarly, rotating the handle 16 in the counterclockwise direction will result in the hex drivers 22 rotating in the clockwise direction.

Figure 2:
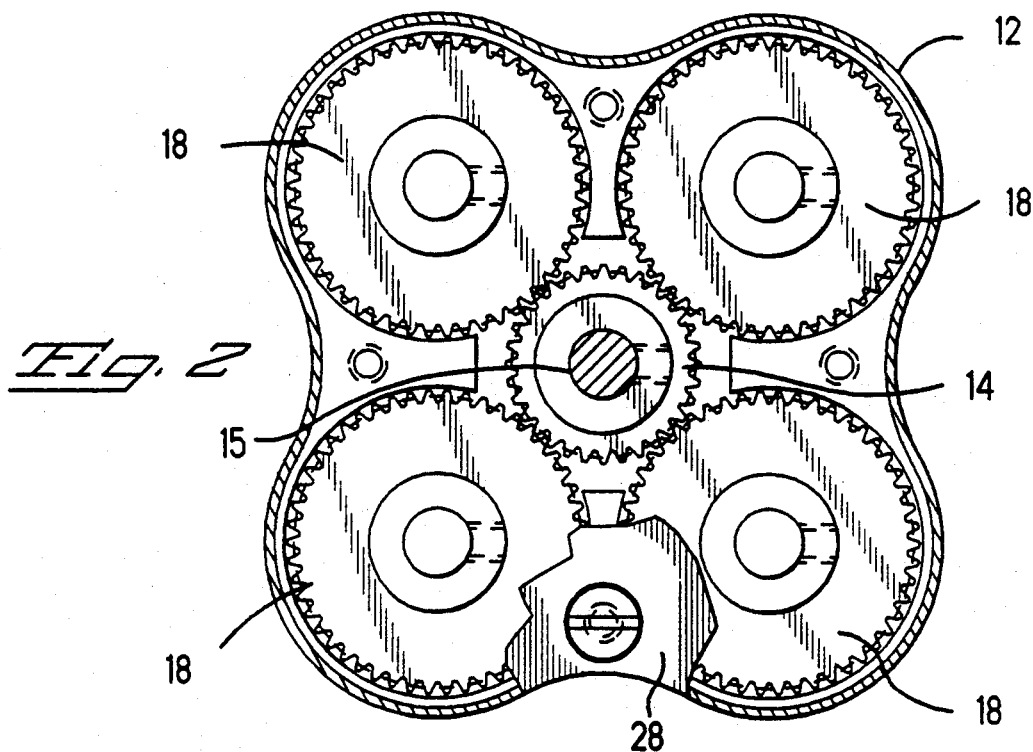
FIG. 2 is a transverse cross section of a tool made according to the present invention.

As best shown in FIG. 2, the tool 10 comprises the frame member 12, the first gear means 14 and the rotationally engaged plurality of engaging gear means 18. Returning to FIG. 1 operating the handle 16 will rotate the first gear means 14 which rotationally engages each of the plurality of engaging gear means 18 to rotate. Preferably, handle 16 is normally biased by spring means such as coil spring 24 and washer 26 away from top surface 28 of frame member 12 to disengage first gear means 14 from gear means 18 to permit angular adjustment of shafts 20 individually prior to tool use. During use, handle 16 is urged toward top surface 28 to engage first gear means 14 with the plurality of engaging means 18 for actuation.

Figure 3:
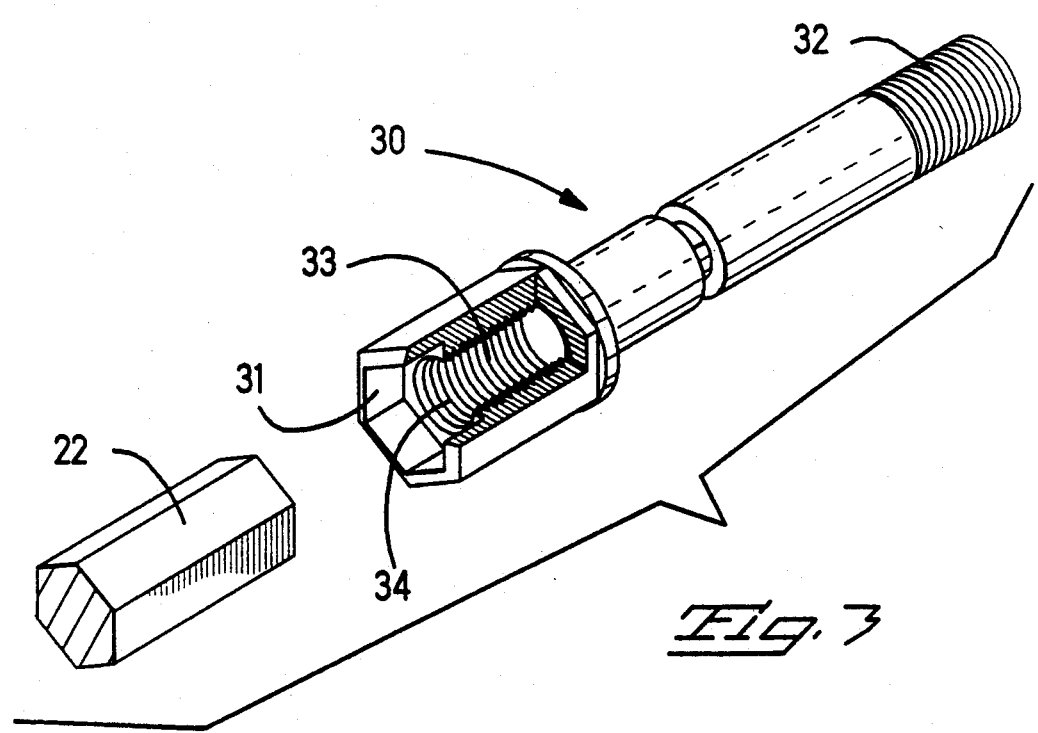
FIG. 3 is an example of a fastening means and fastening head for use in accordance with the present invention.
Figure 7:
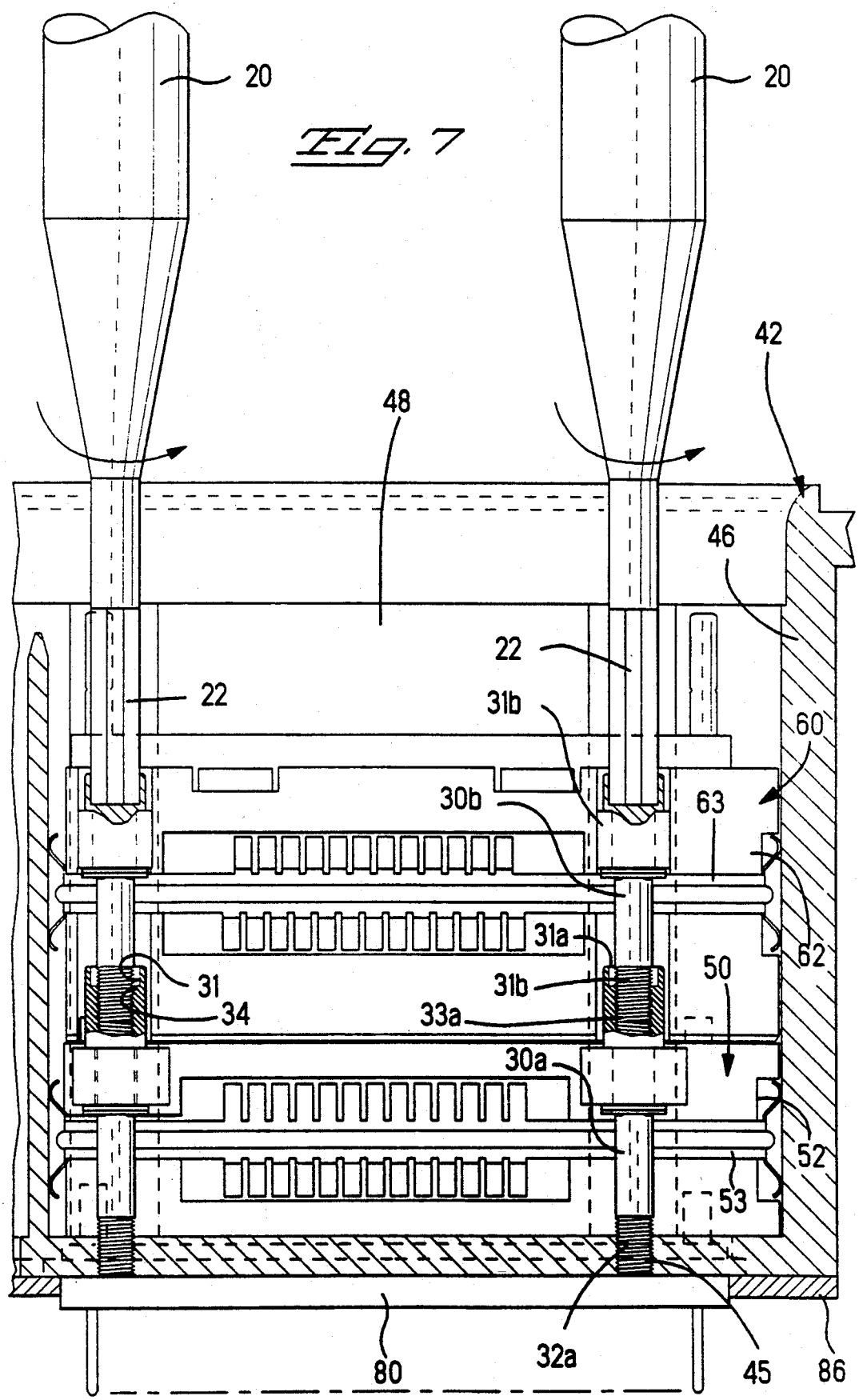
FIG. 7 is an enlarged partial elevation of a tool and a modular connector assembly in cross-section designed to be assembled/disassembled with the use of the tool made according to the present invention.

As shown in FIG. 3, the preferred fastening means according to the present invention is a jack-screw 30 is defined by a hex end 31 and a threaded end 32. The hex end 31 is designed to fit a corresponding hex driver 22. The hex end 31 of the jack-screw 30 also comprises threads 33 in a threaded inner portion 34 of an aperture formed on the hex end 31 for receiving the threaded end of another screw (as shown in FIG. 7).

Figure 4:
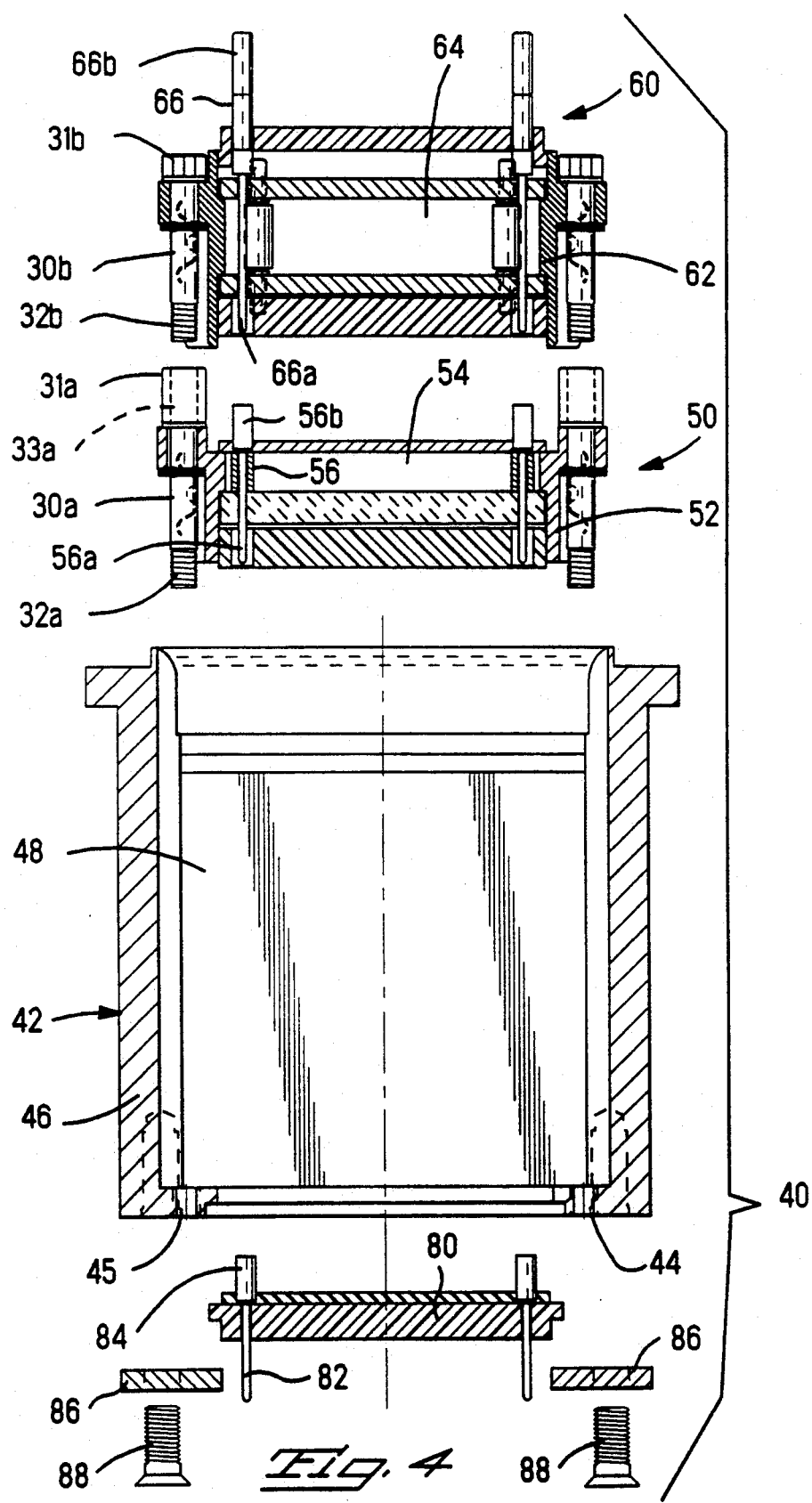
FIG. 4 is a cross sectional exploded top view of a modular electrical connector designed to be assembled by the tool of the present invention.

As shown in FIG. 4, a modular connector assembly 40 may readily be assembled by use of tool 10 of the present invention. The modular connector assembly 40 comprises an outer or main shell assembly 42 having a pin grid array 80 affixed along the first face 44, with the walls 46 of main shell assembly 42 forming an aperture 48. Pin grid array 80 includes electrical terminals 82 that have socket contact ends 84 adapted to receive therein corresponding elongated electrical pin contacts. Threaded apertures 45 are provided in the main shell assembly 42 for receiving the threaded end of a jack-screw of the first module to be installed into the main shell assembly 42.

Merely by way of example, filter module 50 comprises an inner or module shell 52 within which is mounted a subassembly or insert 54 containing an array of electrical terminals 56 and filter components (not shown) associated therewith and affixed between dielectric substrates and electrically grounded to inner shell 52. Electrical terminals 56 include elongate forward pin contact sections 56a adapted to mate with complementary socket contact ends 84 of corresponding electrical terminals 82 on pin grid array 80. Jack-screw 30a with a hex end 31a is designed to be engaged by hex driver 22 (or the fastening head of the tool 10). Electrical terminals 56 of filter module 50 also include socket contact rearward ends 56b to receive a pin contact section thereinto.

By way of further examples, a transient suppression module 60 comprises an inner or module shell 62 in which is mounted a subassembly or insert 64 containing an array of electrical terminals 66 and transient suppression components (not shown) associated therewith and affixed between dielectric substrates and electrically grounded to inner shell 62. Electrical terminals 66, like terminals 56, include elongate forward pin contact sections 66a and socket contact rearward sections 66b; elongate forward pin contact sections 66a are matable with socket contact rearward sections 56b of electrical terminals 56, while socket contact rearward sections 66b are exposed along the rearward face of module 60 to define a mating interface for elongate pin contacts of an array of circuit lines (not shown). A screw 30b defined by a hex screw end 31b is adapted to be engaged by a hex driver 22. The screw 30b is also defined by a threaded end 32b which is adapted to engage the threads 33a on the hex end 31a of the jack-screw 30a of the filter module 50.

Filter module 50 and transient suppression module 60 are designed to fit into aperture 48 formed by walls 46 of main shell assembly 42. When both filter module 50 and transient suppression module 60 are installed, an electrical pathway is defined from terminals 84 of pin grid array 80 to terminals 66 of transient suppression module 60. Each inner shell 52, 62 has secured therearound a grounding strap 53, 63 containing arrays of spring fingers engagable with main shell assembly 42 upon assembly. An example of such a strap is disclosed in U.S. Pat. No. 4,874,337.

Figure 5:
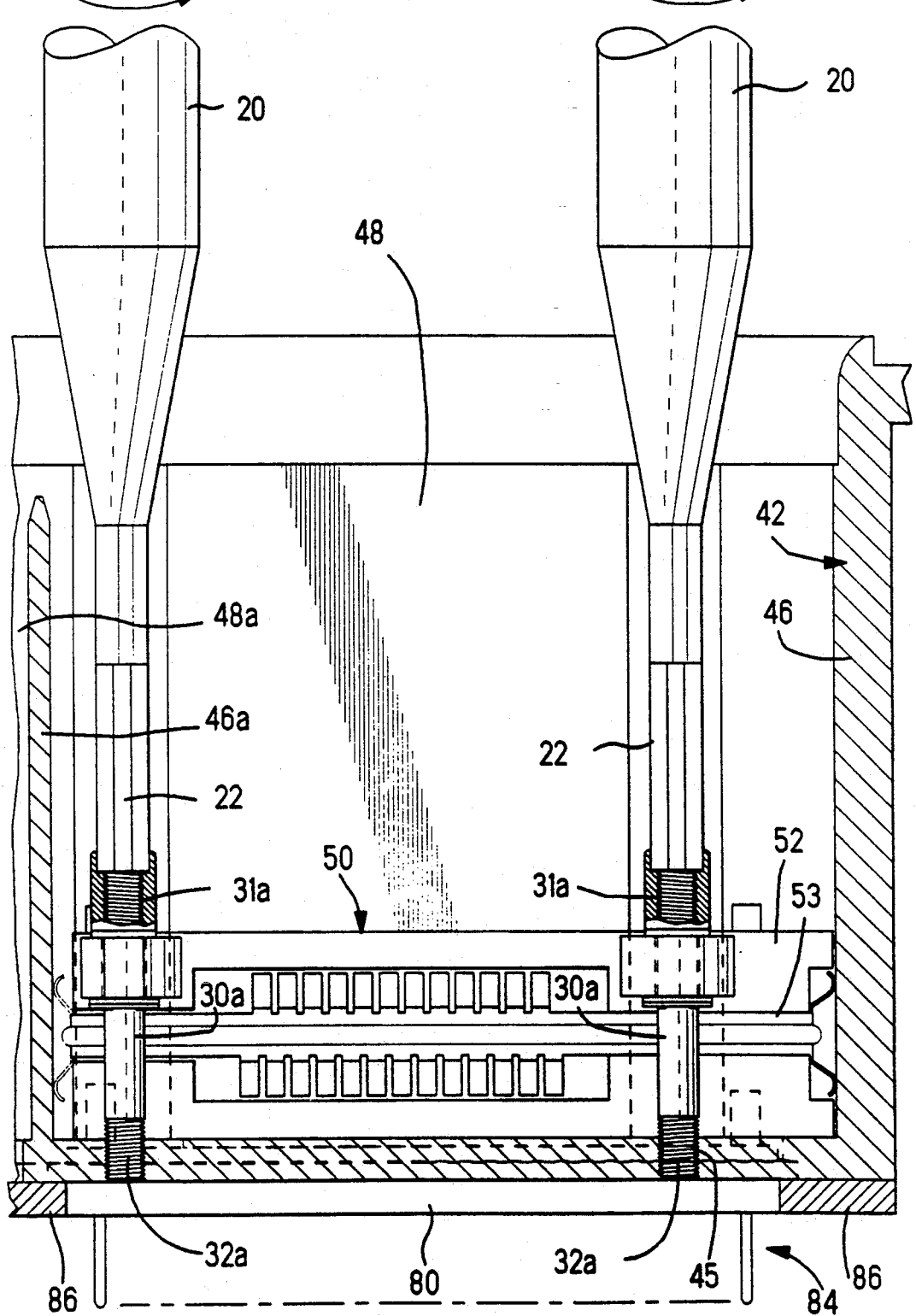
FIG. 5 is an enlarged partial elevation of the tool made according to the present invention with its fastening heads engaged to tighten or loosen the fastening means of a module within an outer shell of a modular connector assembly shown from a side thereof in cross-section.

As shown in FIG. 5, for the purpose of illustration, a first unit or modular connector assembly 40 comprising the main shell assembly 42 is being fixedly attached to a second unit or filter module 50; main shell assembly 42 may be adapted for another module in an adjacent aperture 48a separated by center wall 46a. Pin grid array 80 is affixed into main shell assembly 42 by retention plates 86 fastened to front face 44 of main shell assembly 42 by screws 88, which overlap flanged edge portions of pin grid array 80. Filter module 50 is inserted into aperture 48 of main shell assembly 42 so that the threaded ends 32a of jack-screws 30a are aligned with corresponding threaded apertures 45 in main shell assembly 42. Hex drivers 22 are then engaged with hex socket ends 31a of jack-screws 30a. The power delivery means (not shown) is operated to turn hex drivers 22 and simultaneously tighten each corresponding jack-screw 30a of filter module 50 into a respective threaded aperture 45 in the first face 44 of main shell assembly 42. Through the simultaneous tightening of jack-screws 30a by applying rotational force to hex ends 31a, filter module 50 is fixedly attached to main shell assembly 42. Additionally, the elongated electrical contacts (not shown) of the filter module 46 are inserted into the corresponding socket contact ends of terminals 84 positioned in pin grid array 80.

Figure 6:
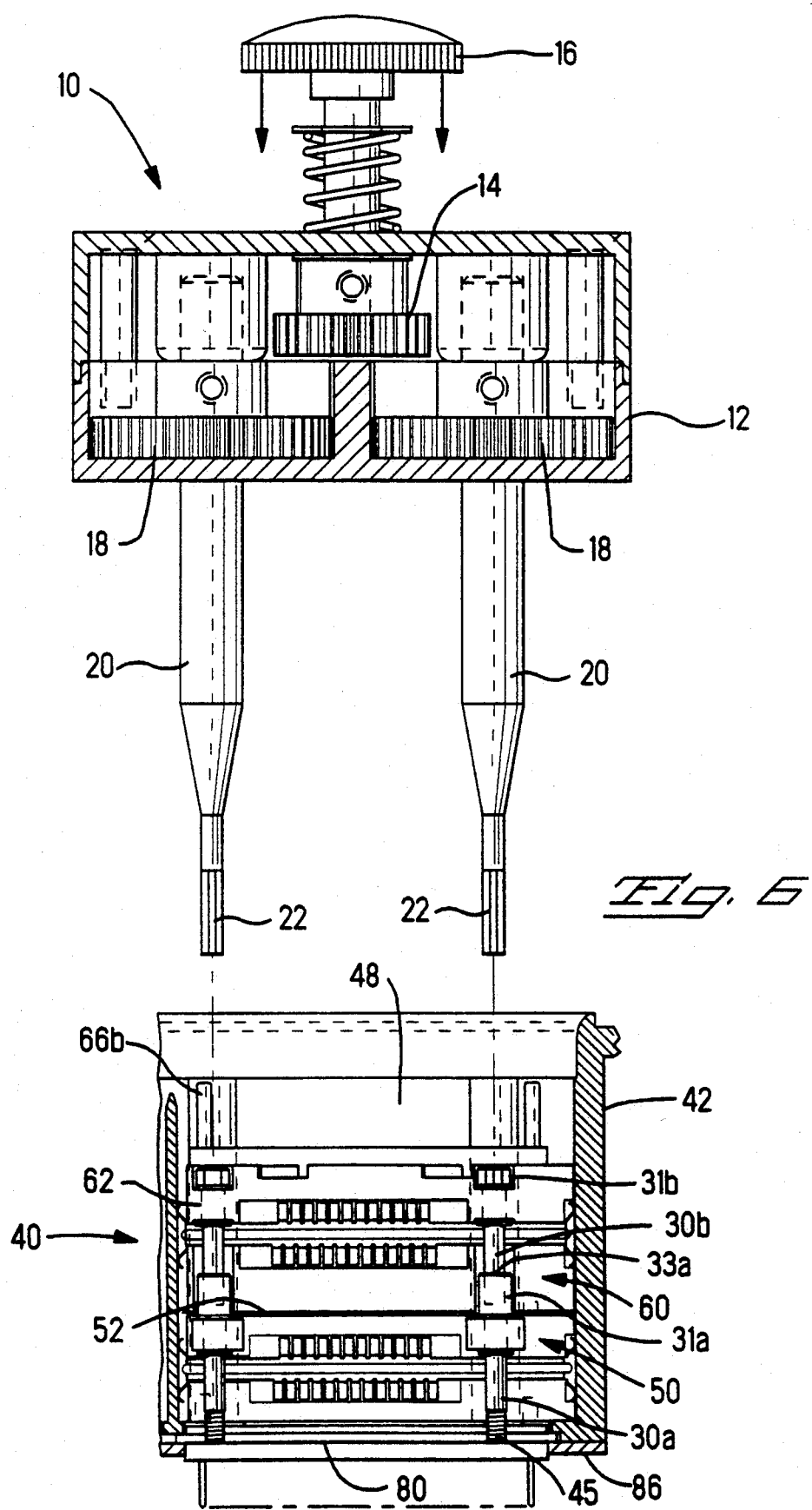
FIG. 6 is a cross section of the tool made according to the present invention with its fastening heads engaged to tighten or loosen the fastening means of a second unit or module for insertion into the modular connector assembly of FIG. 5.

As shown in FIGS. 4 to 6, transient suppression module 60 is inserted into aperture 48 of main shell assembly 42 in a position that sandwiches the filter module 50 between pin grid array 80 and transient suppression module 60. The unit (or module) comprising transient suppression module 60 is fixedly attached to the second unit comprising filter module 50. Each screw 30b (or the like) of transient suppression module 60 is aligned with a corresponding jack-screw 30a of filter module 50. The threaded end 32b of each screw 30b is engaged with the corresponding threaded end 31a of each jack-screw 30a. Hex drivers 22 of tool 10 are engaged with each hex end 31b of each screw 30b. The power delivery means (not shown) is operated to turn hex drivers 22 and simultaneously tighten screws 30b of transient suppression module 60 into threads 33a on each jack-screw 30a of filter module 50. A lubricating oil may be applied to the threads 33a of threaded inner aperture portion 34 of jack-screw 30a, or to the threaded end 32b of jack-screw 30b. Additionally, a conventional relatively weak adhesive is placed in openings 45 of the main shell to increase resistance to unthreading jack-screws 30a from the main shell. This all assures that during module removal, screws 30b of the transient suppression module 60 rotate prior to the rotation of the jack-screws 30a.

Shown in FIG. 7 are the tool 10 and the assembled modular connector assembly 40 in which are positioned the filter module 50 and the transient suppression module 60. The operation of tool 10 in this drawing is in the following manner.

Variations on the embodiment described above are possible. Merely by way of example, modular connector assembly 40 may be adapted to comprise any number of fastening means depending on the size of the modules to be installed and the specific requirements warranted by working condition, but will generally be at least two. Thus, tool 10 should be adapted to possess a corresponding number of fastening heads to engage the fastening means.

The choice of the specific fastening means will likewise dictate the choice of the fastening heads or work ends of the tool. When the fastening means is a hex screw, the fastening heads will comprise hex drivers. Similarly, where the fastening means are phillips screws, the fastening heads will optimally comprise phillips drivers. In addition, the fastening means can be any fastening means known in the art which are amenable to removal and insertion in a precise manner. Thus, although screws are preferred, and most particularly jack-screws, one skilled in the art can easily define art equivalent fastening means that can be adapted to the present invention.

The power delivery means may be any mechanism through which power can be transferred to the gear means to turn the fastening heads. Suitable mechanisms for an appropriate power delivery means include a manually operated handle, a manually operated electric power tool or air wrench, or a robotic power system.

The embodiments described above provide a number of significant advantages. For example, during insertion, a precise spatial and axially aligned relationship is maintained between each elongated electrical pin contact of each module and its corresponding socket contact terminal forwardly thereof. This is important to the functional viability of the modular connector assembly 40 because even a slight change in the spatial or axial relationship will commonly result in bending or damage to the elongated electrical pin contact. This is due in part to the fragile nature of the electrical contacts and terminals, and also to the precise fit of the pin contact section into the socket contact section of a corresponding terminal. The tool 10 according to the present invention is also amenable to use by robotic installation.

In addition, modular connector assemblies intended to be assembled or disassembled through the use of the tool of the present invention will often contain a large number of elongated electrical contacts and a corresponding number of terminals adapted to receive the elongated electrical contacts. In this case, it becomes very important to maintain a precise spatial and axially aligned relationship between the contacts and the terminals to avoid damaging any of the contacts or terminals. Damage to even one contact will often necessitate the replacement of the entire modular connector assembly. The use of the tool according to the present invention will prevent damage by maintaining this precise spatial and axial relationship during insertion.

Of course, it should be understood that a wide range of changes and modifications can be made to the preferred embodiment described above. It is therefore intended that the foregoing detailed description be regarded as illustrative rather than limiting, and that it be understood that it is the following claims, including all equivalents, which are intended to define the scope of this invention.

We claim:

1. A method for inserting or removing a first unit containing at least one elongated electrical pin contact into or out of a second unit containing at least one corresponding electrical socket terminal adapted to receive said elongated electrical pin contact, said first unit being fastenable to said second unit by at least two fastening means, comprising the following steps:

(i) providing a tool comprising:
   (1) a frame member;
   (2) a drive means supported by said frame member;
   (3) a power delivery means fixedly attached to said drive means
   (4) a plurality of engaging means rotationally engaged by said drive means, each of said plurality of engaging means having attached through its center a shaft; and
   (5) a fastening head attached at one end of each of said shafts, each of said fastening heads positioned on the same side of said plurality of engaging means;
  (ii) engaging said fastening means with said fastening heads; and
  (iii) operating said power delivery means to rotate said drive means thereby simultaneously rotating said plurality of engaging means and each of said attached fastening heads which are engaged with and rotate each of said fastening means in a substantially similar fashion, fixedly attaching said first unit to said second unit in a precise spatial relationship.

2. The method according to claim 1, for said first unit containing a plurality of electrical contacts adapted to be received by a plurality of corresponding terminals in said second unit, providing sufficient force to overcome inherent mating force of said plurality of electrical contacts and terminals of said first and second units.

3. The method according to claim 1, wherein said fastening heads comprise screwdrivers and said at least two fastening means comprise screws.

4. The method according to claim 1, wherein said fastening means comprise jack-screws.

5. The method according to claim 1, wherein a third unit is inserted into electrical contact with said first unit or removed therefrom by repeating said steps (i) to (iii).

6. The method according to claim 1, wherein said first unit comprises a filter module, said second unit comprises a main shell assembly containing a corresponding at least one terminal defined within pin grid array, and said third unit comprises a transient suppression module comprising another at least one corresponding terminal.

* * * * *